(12) United States Patent
Iwasaki (10) Patent No.: US 7,679,717 B2
(45) Date of Patent: Mar. 16, 2010

(54) EXPOSURE APPARATUS

(75) Inventor: Yuichi Iwasaki, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 426 days.

(21) Appl. No.: 11/563,885

(22) Filed: Nov. 28, 2006

(65) Prior Publication Data

US 2007/0146667 A1    Jun. 28, 2007

(30) Foreign Application Priority Data

Dec. 28, 2005   (JP)   ............... 2005-380284

(51) Int. Cl.
G03B 27/42    (2006.01)
G03B 27/52    (2006.01)
(52) U.S. Cl. .......................... 355/53; 355/30
(58) Field of Classification Search ............. 355/30, 355/53, 67, 71, 72–76; 378/34, 35
See application file for complete search history.

(56) References Cited

U.S. PATENT DOCUMENTS 4,768,291 A * 9/1988 Palmer .................. 34/443
2004/0263809 A1 * 12/2004 Nakano ................ 355/30
2006/0050257 A1    3/2006 Honda
2008/0030694 A1 * 2/2008 Nagahashi ............. 355/30

FOREIGN PATENT DOCUMENTS

| JP | 2005-150290 |   | 6/2005 |
|---|---|---|---|
| JP | 2006-073906 |   | 3/2006 |
| JP | 2006-173340 |   | 6/2006 |
| WO | WO 2004/086470 | * | 7/2004 |
| WO | 2005/048328 |   | 5/2005 |
| WO | 2005/031824 | * | 7/2005 |

* cited by examiner

*Primary Examiner*—Hung Henry Nguyen
(74) *Attorney, Agent, or Firm*—Rossi, Kimms & McDowell, LLP (57) ABSTRACT

An exposure apparatus for exposing a pattern of a reticle onto a substrate includes a projection optical system for projecting the pattern onto a substrate, the exposure apparatus exposing the substrate through a flammable liquid that is filled in a space between the substrate and a final lens of the projection optical system closest to the substrate, and an explosion-proof unit for shielding an ignition source that can ignite the liquid or vapor of the liquid, from the liquid and the vapor.

6 Claims, 8 Drawing Sheets

EXPOSURE APPARATUS

BACKGROUND OF THE INVENTION

The present invention relates generally to an exposure apparatus, and more particularly to an immersion exposure apparatus.

A projection exposure apparatus has been conventionally employed which exposes a circuit pattern of a reticle (mask) onto a wafer via a projection optical system. Recently, an exposure apparatus having a higher resolution, throughput, and transfer precision has been increasingly demanded. The immersion exposure is one attractive means to meet the demand for the high resolution.

The immersion exposure uses a liquid (immersion material) for a medium at the wafer side of the projection optical system, promoting a high numerical aperture (NA) of the projection optical system. The NA of the projection optical system is defined as NA=n×sin θ, where n is a refractive index of the medium. The NA increases up to "n" when a medium having a refractive index higher than the air's refractive index, i.e., n>1 is filled in the space between the projection optical system and the wafer. The immersion exposure intends to reduce the resolution R of the exposure apparatus which is defined as R=k1×(λ/NA), where k1 is a process constant, and λ is a wavelength of a light source.

In the immersion exposure, a local fill system is proposed which locally fills the liquid in a space between the final lens of the projection optical system and the wafer. See, for example, Japanese Patent Application, Publication No. 2005-150290.

While the conventional immersion exposure apparatus uses water for the immersion material, the immersion material having a higher refractive index is being developed to meet the demand for finer processing. National Institute of Standards and Technology ("NIST") proposes some immersion materials each having a higher refractive index than that of water, such as inorganic acid or salt added water (e.g., H3PO4) and alcohol derivatives (e.g., 1,2,3-propanetriol). Mitsui Chemicals, Inc. and JSR Corporation propose to use flammable hydrocarbon organic liquid for the immersion material having a high refractive index. This immersion material when used for a conventional immersion exposure apparatus is likely to burn due to ignition sources provided in the immersion exposure apparatus, such as an electric circuit, a motor, and an exoergic component.

BRIEF SUMMARY OF THE INVENTION

The present invention is directed to an immersion exposure apparatus that can use a flammable immersion material.

An exposure apparatus for exposing a pattern of a reticle onto a substrate includes a projection optical system for projecting the pattern onto the substrate, the exposure apparatus exposing the substrate through a flammable liquid that is filled in a space between the substrate and the projection optical system, and an explosion-proof unit for shielding an ignition source that can ignite the liquid or vapor of the liquid, from the liquid and the vapor.

Other objects and further features of the present invention will become readily apparent from the following description of the preferred embodiments with reference to accompanying drawings.

DETAILED DESCRIPTION OF THE PREFERRED EMBODIMENTS

Referring now to the accompanying drawings, a description will be given of an exposure apparatus according to one aspect of the present invention. In each figure, the same elements are designated by the same reference numerals, and a duplicate description thereof will be omitted.

First Embodiment

Figure 1:
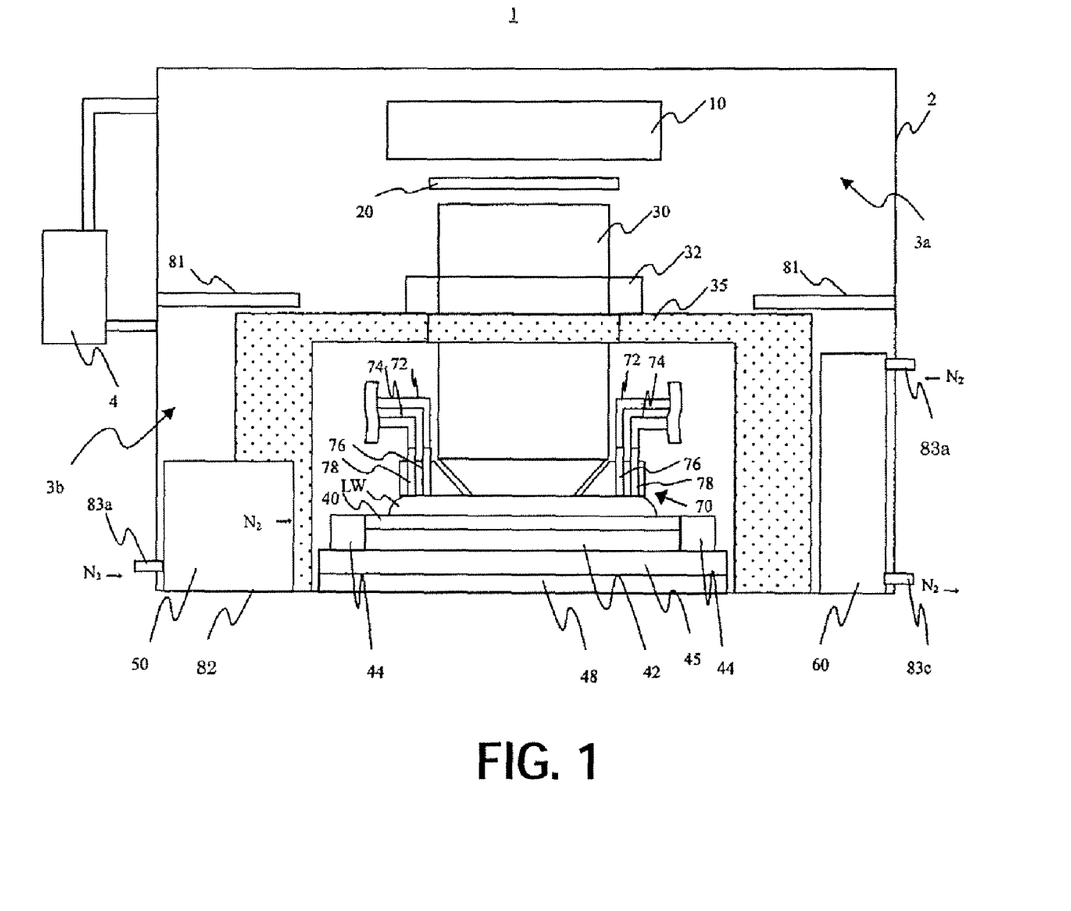
FIG. 1 is a schematic sectional view of an exposure apparatus according to one aspect of the present invention.

FIG. 1 is a schematic sectional view showing a structure of the exposure apparatus 1 according to a first embodiment of the present invention. The exposure apparatus 1 is an immersion exposure apparatus that exposes a circuit pattern of a reticle 20 onto a wafer 40 in a step-and-scan manner via a liquid (immersion material) LW supplied to a space between the projection optical system 30 and the wafer 40. The exposure apparatus 1 may apply a step-and-repeat manner.

The exposure apparatus 1 includes, as shown in FIG. 1, an illumination apparatus 10, a reticle stage that supports the reticle 20, a projection optical system 30, a wafer stage 45 that supports the wafer 40, a liquid supply/recovery unit 70, and an explosion-proof means (81, 82).

The illumination apparatus 10 illuminates the reticle 20 that has a circuit pattern to be transferred. The illumination apparatus 10 includes a light source unit, and an illumination optical system.

The light source unit uses as a light source, for example, an ArF excimer laser with a wavelength of approximately 193 nm in this embodiment. However, the light source unit is not limited to the ArF excimer laser, and may use, for example, an F2 laser with a wavelength of approximately 157 nm.

The illumination optical system is an optical system that illuminates the reticle 20 using the light from the light source unit.

The reticle 20 is fed from the outside of the exposure apparatus 1 by a reticle feeding system (not shown), and is supported and driven by the reticle stage. The reticle 20 is made, for example, of quartz, and has a circuit pattern to be transferred. The diffracted lights emitted from the reticle 20 pass the projection optical system 30, and are projected onto the wafer 40. The reticle 20 and the wafer 40 are located in an optically conjugate relationship. Since the exposure apparatus 1 of this embodiment uses a step-and-scan system, the reticle 20 and the wafer 40 are scanned at a speed ratio of the reduction ratio to transfer the pattern of the reticle 20 to the wafer 40.

The reticle stage is attached to a stool (not shown) that fixes the reticle stage. The reticle stage supports the reticle 20 via a reticle chuck, and its movement is controlled by a moving mechanism (not shown) and a controller (not shown).

The projection optical system 30 serves to image diffracted lights from the pattern of the reticle 20. The projection optical system 30 has a final lens that contacts the liquid LW, and is closest to the wafer 40 in the projection optical system 30. The projection optical system 30 may use a dioptric optical system solely including a plurality of lens, a catadioptric optical system including a plurality of lens and at least one concave mirror, and so on. In this embodiment, the reference numeral 30 covers not only the projection optical system 30 but also a barrel that accommodates the projection optical system 30. The barrel is supported on a barrel stool 35 via a connector 32.

The wafer 40 is fed from the outside of the exposure apparatus 1 by a wafer feeding system 50, and supported and driven by the wafer stage 45. The wafer 40 is a substrate to be exposed, but may broadly cover a glass plate and other substrates to be exposed. A photoresist is applied onto the wafer 40.

A flat-topped plate (auxiliary plate) 44 is a plate that forms a flat-topped plane. The flat-topped plate 44 is approximately level with the surface of the wafer 40. The flat-topped plate 44 supplements holding of the liquid film in exposing the periphery of the wafer 40.

The wafer stage 45 is attached to a stage stool 48 that fixes the wafer stage 45. The wafer stage 45 supports the wafer 40 via a wafer chuck 42. The wafer stage 45 serves to adjust a position in the vertical or longitudinal direction in addition to the XY directions, a rotational direction and an inclination of the wafer 40, under control of a controller (not shown). During exposure, the controller (not shown) controls the wafer stage 45 so that the plane of the wafer 40 always accords with the focal plane of the projection optical system 30 with high precision.

The liquid supply/recovery unit 70 has a liquid supply unit, and a liquid recovery unit.

The liquid supply unit supplies the liquid LW to the space or aperture between the projection optical system 30 and the wafer 40, and may supply the gas PG around the liquid LW. The liquid supply unit in this embodiment includes a generator (not shown in FIG. 1), a tank that stores the liquid LW, a compressor that feeds out the liquid LW, a flow rate controller that controls a supply flow rate of the liquid LW or the gas PG, a deaerator that removes the dissolved gas from the liquid LW, a temperature controller, and a liquid supply pipe 72. The liquid supply unit supplies the liquid LW through a liquid supply port 76 arranged around the final lens of the projection optical system 30, and forms a film of the liquid LW in the space between the projection optical system 30 and the wafer 40. The space between the projection optical system 30 and the wafer 40 preferably has such a thickness as 1.0 mm to stably form and remove the film of the liquid LW.

The liquid LW is selected from liquids that are less likely to absorb the exposure light, and preferably has a refractive index greater than that of the final lens. This embodiment uses the flammable organic liquid for the liquid LW.

The liquid supply pipe 72 supplies the deaerated and temperature-controlled liquid LW to the space between the projection optical system 30 and the wafer 40 via the liquid supply port 76 through the deaerator and the temperature controller.

The liquid recovery unit serves to recover the liquid LW supplied by the liquid supply unit, and includes a liquid recovery pipe 74, a tank that temporarily stores the recovered liquid LW, and a flow rate controller that controls the recovery flow rate of the liquid LW. The liquid recovery pipe 74 recovers the liquid through a liquid recovery port 78.

The liquid supply port 76 and the liquid recovery port 78 are configured in a nozzle unit adjacent to the projection optical system 30, and oppose to the wafer 40. This embodiment places the liquid supply port 76 closer to the optical axis of the projection optical system 30 than the liquid recovery port 78. A porous member, such as an inorganic material, may be embedded in the liquid supply port 76 and the liquid recovery port 78, or these ports 76 and 78 may be slit-shaped openings.

The liquid supply port 76 and the liquid recovery port 78 are preferably made of resin, such as poly tetra fluoro ethylene ("PTFE") resin.

The explosion-proof means (81, 82) prevents an ignition and an explosion by shielding the ignition source from the flammable liquid LW or its vapor from the wafer 40 or the flat-topped plate 44. In general, when the vapor of the flammable liquid LW is mixed with the air, a flammable state referred to as an explosion limit occurs.

The explosion-proof means has a partition 81 and a cabinet (housing) 82.

The partition 81 divides the internal space of the chamber 2 that accommodates respective components in the exposure apparatus 1, into an upper space 3a and a lower space 3b, so as to narrow the explosion-proof area. The upper space 3a is a space in which the reticle 20 is driven, and the lower space 3b is a space in which the wafer 40 is driven. This division shields the vapor of the liquid LW from the driving system for driving the reticle 20. The partition 81 is provided near and around the barrel stool 35, and divides the internal space of the chamber 2 in cooperation with the barrel stool 35.

This structure consequently confines the space in which that the flammable vapor exists, in the lower space 3b below the partition 81. An air-conditioner 4 preferably controls the environment of each of the upper space 3a and the lower space 3b, such as the temperature and the humidity.

Figure 2A:
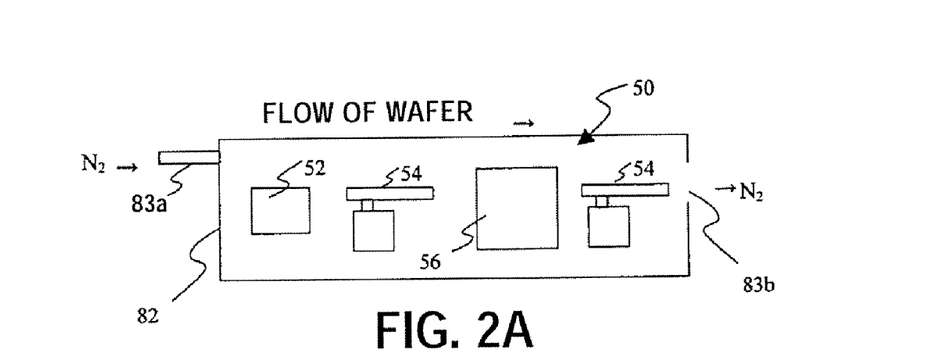
FIG. 2A is a schematic block diagram showing a structure of an explosion-proof means shown in FIG. 1 that includes one metal cabinet shields a whole wafer feeding system.
Figure 2B:
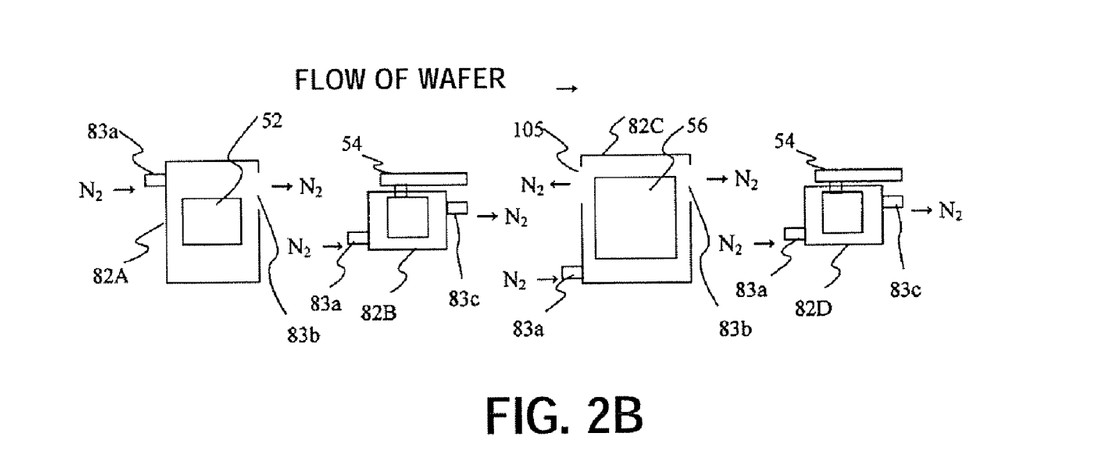
FIG. 2B is a schematic block diagram showing the structure of the explosion-proof means shown in FIG. 1 that includes some metal cabinets shields each unit or motor that can be an ignition source.

The lower space 3b encloses components, such as a motor and an electric circuit, which can be the ignite sources or generate sparks or heats. More specifically, a supply/recovery elevator 52, a feeding hand system 54, or a pre-alignment stage 56, in the wafer feeding system 50 includes the motor and the electronic circuit component. A metal cabinet 82 shields the entire wafer feeding system 50 as shown in FIG. 2A, and provides the internal-pressure explosion-proof construction by flowing compressed nitrogen gas that serves as explosion-proof protective gas or inflammable gas, from a gas inlet 83a to the inside of the cabinet 82. Overflowed nitrogen gas is exhausted from a wafer outlet 83b. Alternatively, for easy maintenance and reduced nitrogen gas usage, another internal-pressure explosion-proof construction may be provided which shields, with metal cabinets 82A to 82D, only respective units and motors that can be ignition sources as shown in FIG. 2B, and flows the nitrogen gas. Overflowed protective gas is exhausted from the wafer outlet 83b when the unit has the wafer outlet 83b, or a gas outlet 83c when the unit does not have the wafer outlet 83. The protective gas may use inexpensive dry air.

An electric-circuit housing 60 houses all the components, such as an electric circuit of the controller, which otherwise exist in the lower space 3b, can be the ignition sources or generate the sparks and heats. The electric-circuit housing 60 provides the internal-pressure explosion-proof construction by flowing compressed nitrogen gas that serves as explosion-proof protective gas or inflammable gas, from a gas inlet 83a to the inside of the electric-circuit housing 60. The protective gas is exhausted from a gas outlet 83c.

Figure 6:
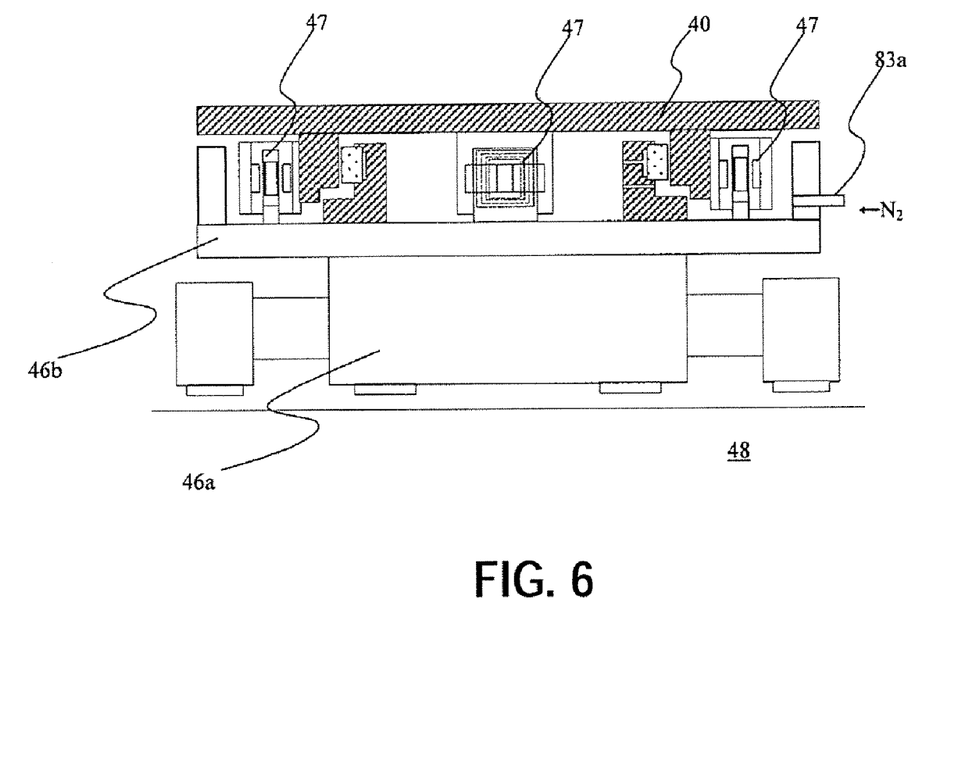
FIG. 6 is a schematic sectional view showing a structure of the wafer stage shown in FIG. 1.

More specifically, the wafer stage 45 includes, as shown in FIG. 6, an X/Y stage 46a, and a θ/Z/Tilt stage 46b. No sparks occur since a linear motor with no electric sliding parts is used to drive the X/Y stage 46a. On the other hand, in the exposure apparatus of this embodiment, a stepping motor 47 is used to drive the θ/Z/Tilt stage 46b and may generate sparks. Accordingly, the θ/Z/Tilt stage 46b is provided with the gas outlet 83a, and nitrogen gas, forming the internal-pressure explosion-proof construction.

The exposure apparatus can safely use the flammable liquid LW by providing the explosion-proof construction shown in FIG. 2A or 2B to the electric circuit and motor that can be otherwise the ignition source in the lower space 3b in the chamber 2. Use of the liquid having a high refractive index can secure a high resolution.

An explosion-proof construction for an electric apparatus is technical means applied to electric machines so that the electric apparatus can be safely used in a space that contains or can contain gas or vapor that can explode or ignite when contacting an ignition source.

Second Embodiment

Figure 3:
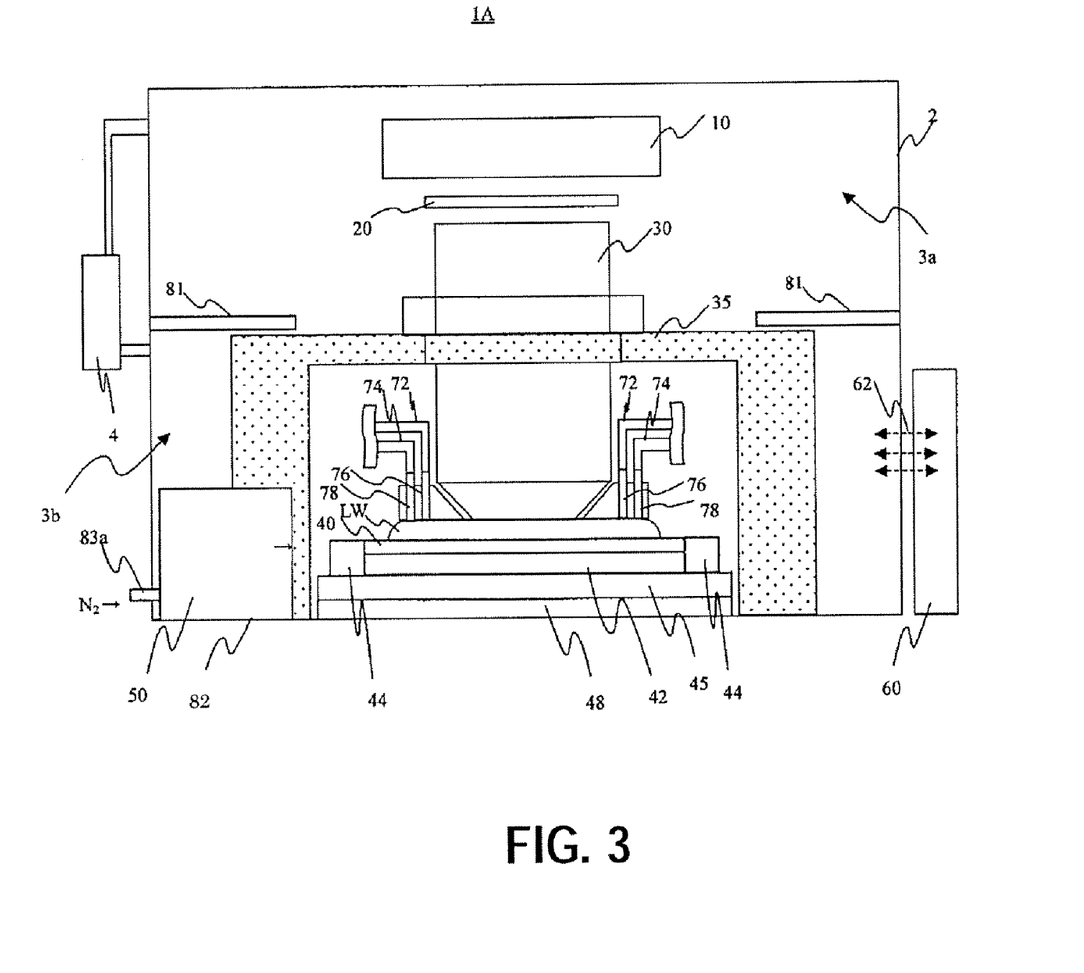
FIG. 3 is a schematic sectional view of an exposure apparatus according to another aspect of the present invention.

FIG. 3 is a schematic sectional view of an exposure apparatus 1A according to a second embodiment of the present invention. Similar to the first embodiment, the partition 81 divides the internal space of the chamber 2. The exposure apparatus 1A is different from the exposure apparatus 1 in that the exposure apparatus 1A arranges the movable potential ignition source, such as the electric-circuit housing 60, outside the chamber 2. And a internal-pressure explosion-proof construction isn't applied to the electric-circuit housing 60. The components in the electric-circuit housing 60 function with an electric or optical cable 62. A internal-pressure explosion-proof construction is applied to the nonmovable potential ignition source, such as the wafer feeding system 50, as in the first embodiment. The reduced number of components that could be otherwise ignition sources decreases the risk of a fire or an explosion in the exposure apparatus 1A. The reduced number of components that require the explosion-proof construction reduces the cost.

Thereby, the exposure apparatus 1A can stably use the flammable liquid LW having a high refractive index, and achieve a high resolution.

Third Embodiment

Figure 4:
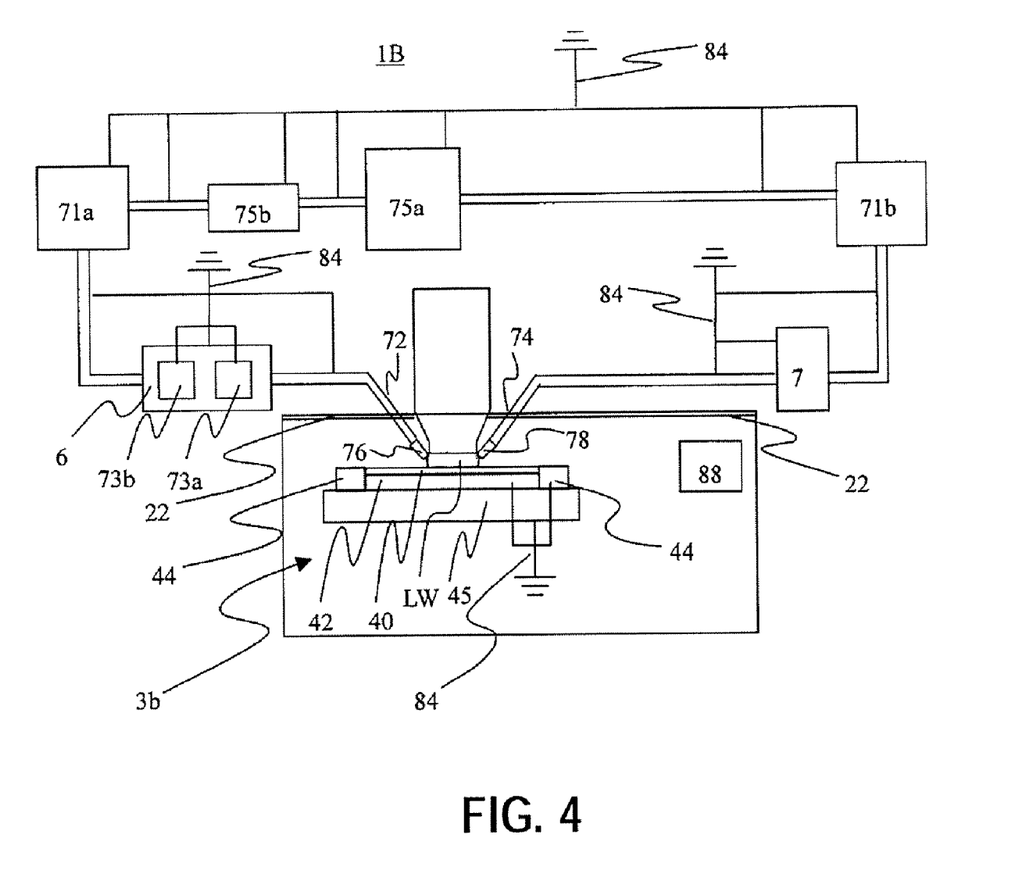
FIG. 4 is a schematic sectional view of an exposure apparatus according to still another aspect of the present invention.

FIG. 4 is a schematic sectional view of an exposure apparatus 1B according to a third embodiment of the present invention, showing the lower space 3b below the partition 81 near the barrel stool 35. In the exposure apparatus 1B, the liquid LW passes from the tank 71a to the supply port 76 through the supply pipe 72, the temperature controller 73a, the deaerator 73b, etc., and then reaches the wafer 40 through the supply port 76. The temperature controller 73a controls the temperature of the liquid LW, and the deaerator 73b removes the gas contained in the liquid LW. 6 denotes an immersion liquid supplier. 7 denotes an immersion liquid collector.

The liquid forms a film. After the wafer 40 is exposed via the film, the liquid LW is recovered from the recovery port 78 and collected in the recovery tank 71b through the recovery pipe 74. The flammable liquid LW is preferably made reusable viewed from its cost. In this case, a liquid recycle system is configured so that the liquid used for the exposure is collected in the recovery tank 71b as shown in FIG. 4, and then returned to the supply tank 71a through a purifier 75a, a filter 75b, and a measuring unit (not shown) for controlling the purity.

In general, the liquid causes static electricity due to streaming charges and agitations during piping transportations, for example, through the tube. In the scanner, the liquid flows in the pipe, stirs and flows in the space between the lens and wafer. Thus, the liquid is highly likely to generate the static electricity, and charge with electricity. In particular, the flammable organic liquid is generally less conductive and is likely to store the static electricity. Thus, the flammable organic liquid promises a fire and an explosion due to the static electricity. Moreover, a liquid having an electrical conductivity of $1 \times 10^{-10}$ S/m or smaller is likely to charge with static electricity. When another conductor approaches to the charged liquid, a discharge occurs at a certain distance and the heat energy is emitted. This discharge becomes an ignition source with a sufficient amount of surrounding flammable gas, causing a fire and an explosion.

One antistatic measure is a ground or earth 84 connected to all the liquid contacting members, such as the supply pipe 72, the recovery pipe 74, the supply port 76, the recovery port 78, the temperature controller 73a, deaerator 73b, the supply tank 71a, the recovery tank 71b, the wafer chuck 42, the wafer stage 45, and the flat-topped plate 44. In addition, each apparatus in the recycle system is grounded or adopts another antistatic measure. A metal pipe, such as a SUS pipe that has undergone a GEP or GEPW process (Kobelco Eco-Solutions Co., Ltd.). When a Teflon pipe is used from the standpoint of the liquid pollution abatement, an antistatic Teflon tube (NAFLON PFA-NE tube (Nichias Corporation) etc.) may be used and grounded.

Figure 5A:
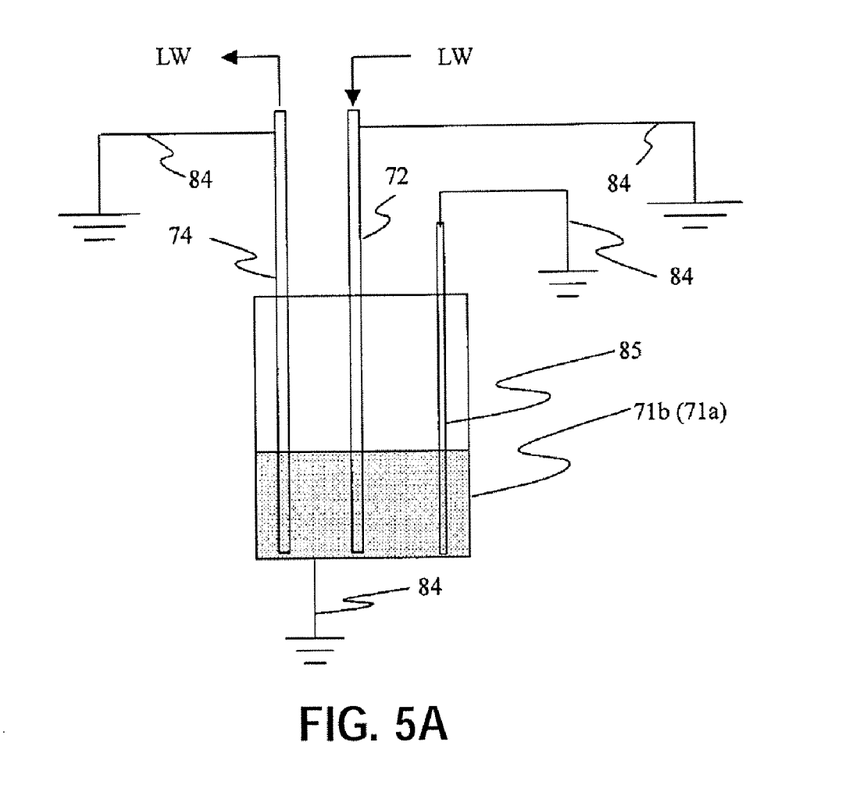
FIG. 5A is a view showing a liquid-contacting member grounding method for a supply or recovery tank.
Figure 5B:
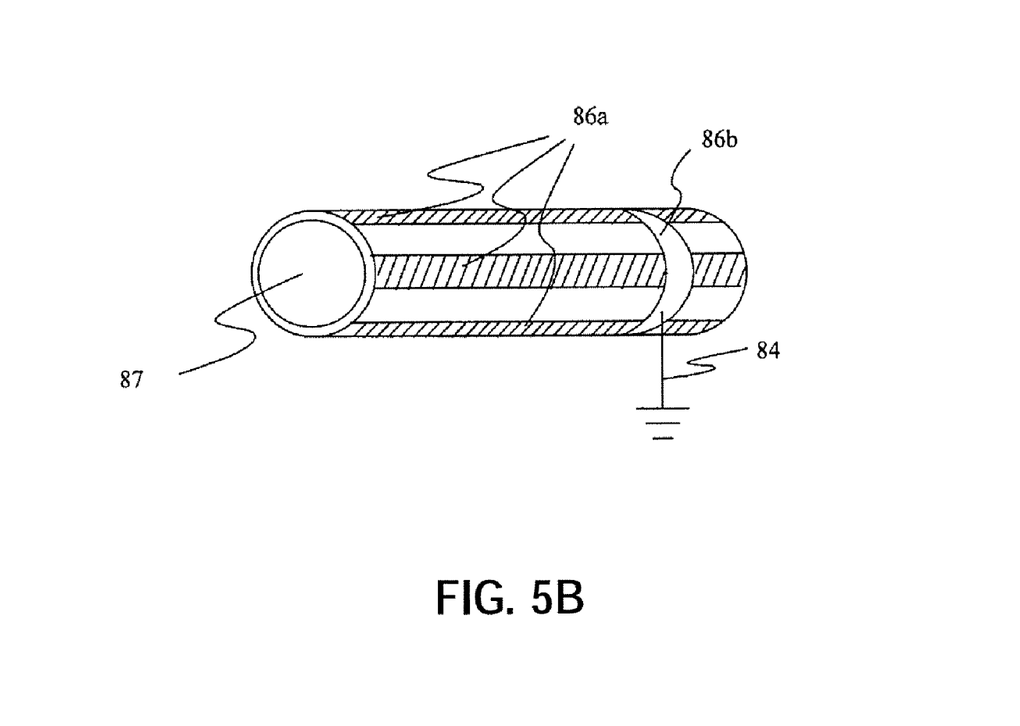
FIG. 5B is a view showing a liquid-contacting member grounding method for a pipe.

FIGS. 5A and 5B show grounding methods. FIG. 5A shows the grounding method for the supply or recovery tank 71a or 71b, and the supply and recovery pipes 72 and 74 are extended as close to the tank as possible in order to reduce the agitations during entry and exit of the liquid. A conductive rod 85 prevents charging of the liquid. Grounds 84 are connected to the supply and recovery pipes 72 and 74, the rod 85, and the tanks 71a and 71b to release the static electricity.

FIG. 5B shows the grounding method for the pipe. Here, FIG. 5B shows an antistatic Teflon tube 87 used for supply and recovery pipes. The tube 87 is provided with conductive thin films 86a at four portions on the outer surface so as to make the tube 87 conductive. At least one connector 86b is provided which electrically connects four conductive thin films 86a, and the connector 86b is connected to the ground 84. When the tube is cut due to a non-conductive joint, the connector 86b and the ground 84 are similarly provided in a continuity range. The metal pipe and joint, and other metallic and conductive member are provided with at least one point connected to the ground 84 in the continuity range.

Another conceivable method is to neutralize the stored charges. For example, a static eliminator 88 when provided in the chamber in which the exposure apparatus is placed can neutralize charges and remove the static electricity from the component and apparatus caused by contacts with the liquid. This method is effective even to an insulator, such as a normal Teflon tube used for the piping. The above two antistatic methods can be combined for a more effective antistatic measure. Other configurations including a structure of the exposure apparatus in the third embodiment are the same as those in the first and second embodiments.

In exposure, the illumination optical system 14 e.g., Koehler-illuminates the reticle 20 using the light emitted from the light source unit. The light that passes the reticle 20 and reflects the reticle pattern is imaged on the wafer 40 by the projection optical system 30 and the liquid LW. Preventing the ignition and explosion of the liquid LW, the exposure apparatus 1 provides higher quality devices (such as semiconductor devices, a liquid crystal devices, and the like) than ever at a high throughput and economical efficiency.

Figure 7:
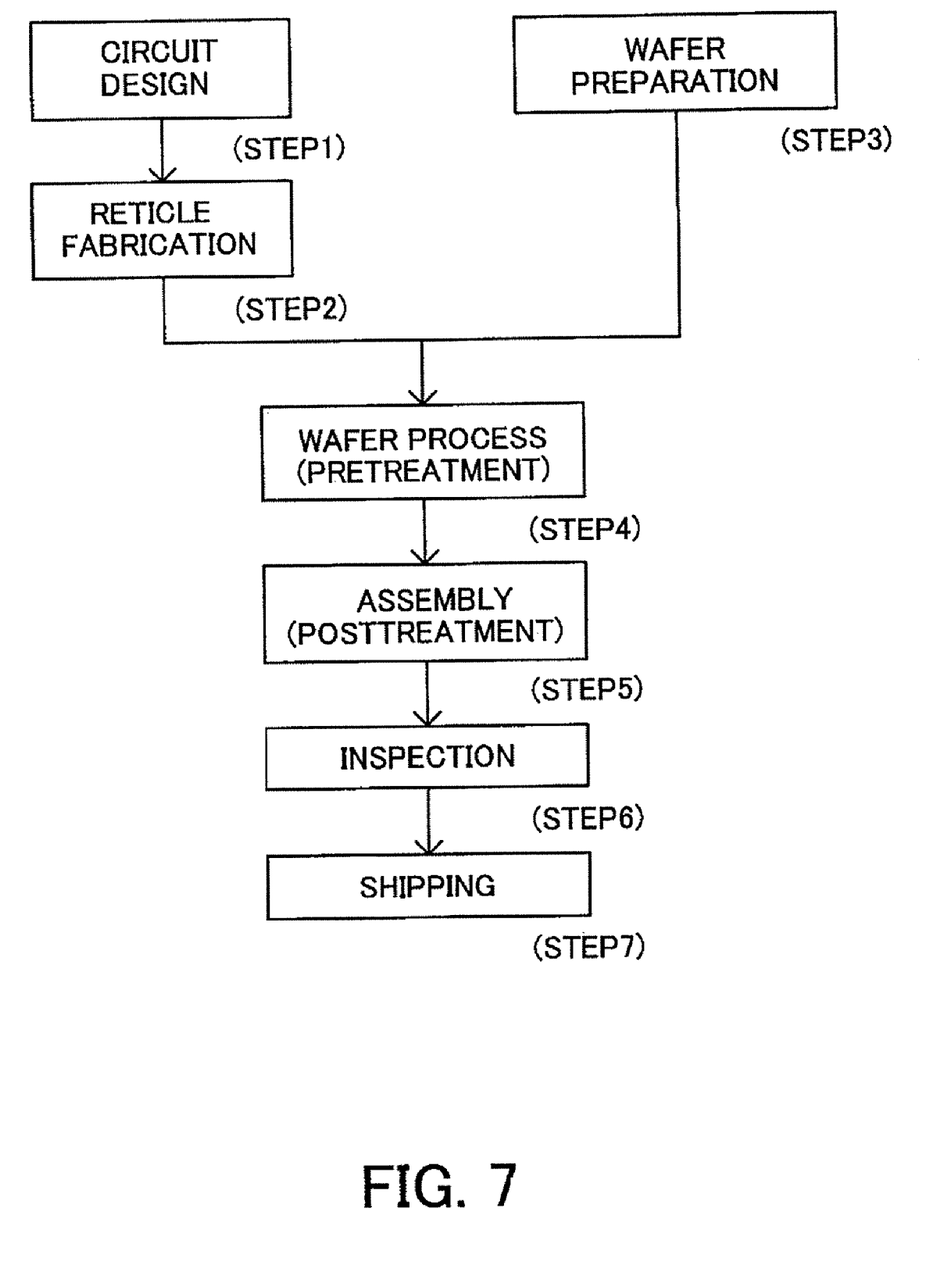
FIG. 7 is a flowchart for explaining manufacture of devices.
Figure 8:
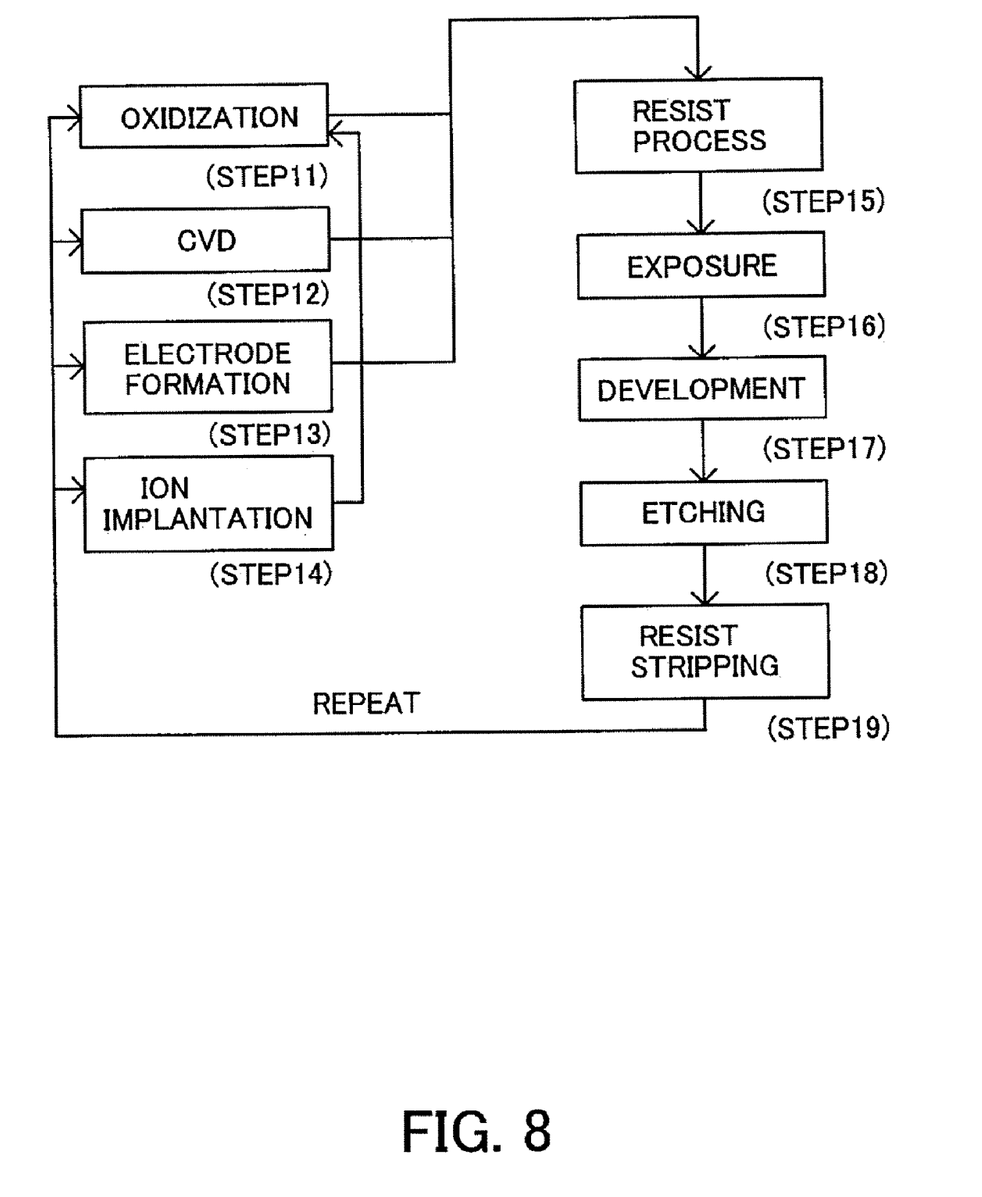
FIG. 8 is a detailed flowchart of a wafer process as Step 4 shown in FIG. 7.

Referring now to FIGS. 7 and 8, a description will be given of an embodiment of a device manufacturing method using the exposure apparatus. FIG. 7 is a flowchart for explaining a fabrication of devices. Here, a description will be given of a fabrication of a semiconductor device as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 8 is a detailed flowchart of the wafer process in Step 4 shown in FIG. 10. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the above exposure apparatus 1 to expose a mask pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This device manufacturing method can manufacture higher quality devices than ever. Thus, the device manufacturing method that uses the exposure apparatus 1, and its resultant products also constitute one aspect of the present invention.

Further, the present invention is not limited to these preferred embodiments, and various variations and modifications may be made without departing from the scope of the present invention.

This application claims a benefit of priority based on Japanese Patent Application No. 2005-380284, filed on Dec. 28, 2005, which is hereby incorporated by reference herein in its entirety as if fully set forth herein.

What is claimed is:

1. An exposure apparatus for exposing a pattern of a reticle onto a substrate, said exposure apparatus comprising:
   a projection optical system for projecting the pattern onto the substrate, said exposure apparatus exposing the substrate through a flammable liquid that is filled in a space between the substrate and said projection optical system; and
   an explosion-proof unit for shielding an ignition source that can ignite the liquid or vapor of the liquid, from the liquid and the vapor,
   wherein said explosion-proof unit includes a housing for housing the ignition source and said housing includes an inlet for introducing inflammable gas or dry air into said housing.

2. An exposure apparatus according to claim 1, further comprising:
   a chamber for accommodating said projection optical system; and
   a barrel stool, accommodated in the chamber, for supporting a barrel of said projection optical system, said explosion-proof unit including a partition for dividing, in cooperation with said barrel stool, an internal space of the chamber into a first space in which the reticle is driven, and a second space in which the substrate is driven.

3. An exposure apparatus according to claim 1, wherein said housing includes an outlet for exhausting inflammable gas or dry air from said housing.

4. An exposure apparatus according to claim 1, further comprising:
   a chamber for accommodating said projection optical system;
   an electric circuit component arranged outside said chamber; and
   a connector for electrically connecting said electric circuit component to a member in said chamber.

5. A device manufacturing method comprising the steps of:
   exposing a substrate using an exposure apparatus, the exposure apparatus comprising a projection optical system for projecting the pattern onto the substrate, said exposure apparatus exposing the substrate through a flammable liquid that is filled in a space between the substrate and said projection optical system, and an explosion-proof unit for shielding an ignition source that can ignite the liquid or vapor of the liquid, from the liquid and the vapor, wherein said explosion-proof unit includes a housing for housing the ignition source and said housing includes an inlet for introducing inflammable gas or dry air into said housing; and
   developing the substrate that has been exposed.

6. An exposure apparatus according to claim 3, wherein said housing is filled with nitrogen gas.

* * * * *